(12) United States Patent
Groff

(10) Patent No.: US 6,525,436 B1
(45) Date of Patent: *Feb. 25, 2003

(54) METHOD AND APPARATUS FOR SUPPRESSING ELECTROMAGNETIC EMISSIONS FROM A BUS INTERFACE WITH ELECTRONIC EQUIPMENT

(75) Inventor: Donald E. Groff, Hatfield, PA (US)

(73) Assignee: General Instruments Corp., Horsham, PA (US)

( * ) Notice: Subject to any disclaimer, the term of this patent is extended or adjusted under 35 U.S.C. 154(b) by 37 days.

This patent is subject to a terminal disclaimer.

(21) Appl. No.: 09/717,984

(22) Filed: Nov. 21, 2000

Related U.S. Application Data

(63) Continuation of application No. 09/265,815, filed on Mar. 10, 1999.
(51) Int. Cl.[7] .................................................. H05K 9/00
(52) U.S. Cl. ........................................ 307/91; 307/104
(58) Field of Search ........................... 307/89–91, 104; 361/818, 683, 687, 111, 113; 363/15, 16, 20

(56) References Cited

U.S. PATENT DOCUMENTS

| | | | | |
|---|---|---|---|---|
| 5,217,010 A | * | 6/1993 | Tsitlik et al. | 128/419 PG |
| 5,475,876 A | * | 12/1995 | Terada et al. | 455/301 |
| 5,894,517 A | * | 4/1999 | Hutchison et al. | 380/9 |
| 6,249,062 B1 | * | 6/2001 | Suzuki et al. | 307/89 |
| 6,271,603 B1 | * | 8/2001 | Kajita | 307/91 |
| 6,400,044 B1 | * | 6/2002 | Lohberg et al. | 307/91 |

OTHER PUBLICATIONS

International Preliminary Examination Report, dated Jul. 6, 2001.

* cited by examiner

*Primary Examiner*—Fritz Fleming
(74) *Attorney, Agent, or Firm*—Rader, Fishman, & Grauer PLLC.

(57) ABSTRACT

An improved electronic device, for example, an upconverter for converting an IF television signal to a VHF or UHF television signal at a broadcast signal headend provides an external, shielded bus interface which connects to filtered internal input and output lines leading to control circuitry. The resulting device suppresses unwanted electromagnetic emissions.

18 Claims, 3 Drawing Sheets

METHOD AND APPARATUS FOR SUPPRESSING ELECTROMAGNETIC EMISSIONS FROM A BUS INTERFACE WITH ELECTRONIC EQUIPMENT

This application is a continuation of prior application Ser. No. 09/265,815, filed Mar. 10, 1999.

FIELD OF THE INVENTION

The present invention relates to the field of stray electrical current emissions which are released by some electronic equipment, particularly where a bus interfaces with the circuitry of an electronic device. More particularly, the present invention relates to the field of suppressing unwanted electrical emissions within an upconverter at the headend of a television signal distribution network.

BACKGROUND OF THE INVENTION

The use of electromagnetic signals to carry information is ubiquitous in modern society. Computers, telephones, radios, and televisions are common examples of electronic devices that use electromagnetic signals to convey data.

However, the proliferation of these devices can also create problems. For example, any of these and similar electronic devices may also emit electromagnetic radiation in addition to making use of electromagnetic signals. Additionally, stray electric currents may escape from electronic devices, particularly where a bus interfaces with circuitry. These emissions of unwanted current or electromagnetic radiation from any of these devices may be picked up by, or interfere with the operation of, some other electronic device, particularly if the two devices are in close proximity to each other.

For these reasons, efforts are made to prevent electronic devices for emitting unwanted stray current or electromagnetic radiation that might interfere with another device. In fact, government or industry standards may be established that limit the amount of such unwanted emissions that a device may emit. The standards set by CENELEC, the European Committee for Electrotechnical Standardization, are particularly stringent.

Unwanted electromagnetic emissions are measured for purposes of the CENELEC standards by placing an absorbing clamp on the device, particularly the wiring leading to and from the device. The absorbing clamp registers the amount of stray electrical current emitted by the device during operation for comparison with established standards.

Consequently, there is a need in the art for an apparatus and method of suppressing stray electrical current from being emitted by operating electronic devices. Particularly, there is a need in the art for an apparatus and method of suppressing the emission of unwanted electric current from an upconverter at the headend of a television signal distribution network, particularly where the control signal bus interfaces with the upconverter circuitry.

SUMMARY OF THE INVENTION

It is an object of the present invention to meet the above-described needs and others. Specifically, it is an object of the present invention to provide a method and apparatus for suppressing unwanted electrical current emissions from electronic devices, particularly in an upconverter for television signal distribution from a headend signal station.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied and described as an electronic device including a device circuit with suppressed emissions of electrical current and electromagnetic radiation. In an important application of the present invention, the device circuit may be an upconverter for converting an IF television signal to a VHF or UHF television signal.

In a particular embodiment, a device according to the present invention includes a device circuit disposed within the device; a bus interface connected to input and output busses for providing data to and from the device, and input and output lines connected between the bus interface and the device circuitry. The bus interface is spaced apart from the device circuit by a distance adequate to suppress electromagnetic emissions caused by the interaction of the bus interface and the device circuitry. The present invention may also include a filtering device for suppressing electromagnetic emissions along each of the input and output lines between the bus interface and the device circuit.

For additional suppression of electromagnetic emissions, the bus interface may be disposed on an exterior surface of a housing for the device circuit. Preferably, the bus interface is disposed in a separate interface housing disposed on the exterior surface of the device housing, where the interface housing is more heavily shielded against electromagnetic emissions than the device housing.

The improved bus interface of the present invention may include an input connector connected to the input bus; an output connector connected to the output bus; and an internal connector connected to the input and output lines. The input and output connectors are both multi-pin connectors in which five pins of the input connector are connected, respectively, five pins of the output connector.

Two pairs of the mutually connected pins of the input and output connectors are then connected through an integrated circuit to the internal connector. While another pair of the mutually connected pins of the input and output connectors is connected through a circuit comprising two transistors to the internal connector. The circuit with two transistors includes (1) a first transistor having a grounded emitter, a collector connected to a voltage source and a base connected to the internal connector; and (2) a second transistor having an emitter connected to the internal connector, a collector connected to the collector of the first transistor and a base connected to the voltage source. The mutually connected collectors of the first and second transistors are also connected to a pin of the input connector.

The present invention also encompasses a method of suppressing emissions of electrical current or electromagnetic radiation in an electronic device that includes a device circuit. The method includes spacing a bus interface connected to input and output busses apart from the device circuit by a distance sufficient to suppress the emissions of stray current or electromagnetic radiation caused by interaction of the device circuit and the interface; and connecting input and output lines between the bus interface and the device circuitry. The method of the present invention may also include filtering unwanted electromagnetic signals from each of the input and output lines to further suppress electromagnetic emissions.

With regard to the placement of the bus interface, the method may include mounting the bus interface on an exterior surface of a housing for the device circuit. This may include mounting the bus interface in an interface housing disposed on the exterior surface of the device housing, in which the interface housing is more heavily shielded against electromagnetic emissions than the device housing.

Again, an important application of the method of the present invention is upconverting an IF television signal to a VHF or UHF television signal with the device circuit, the IF television signal being provided over the input bus and the input line through the bus interface and the VHF or UHF television signal being provided over the output line to the output bus through the bus interface.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

Figure 1:
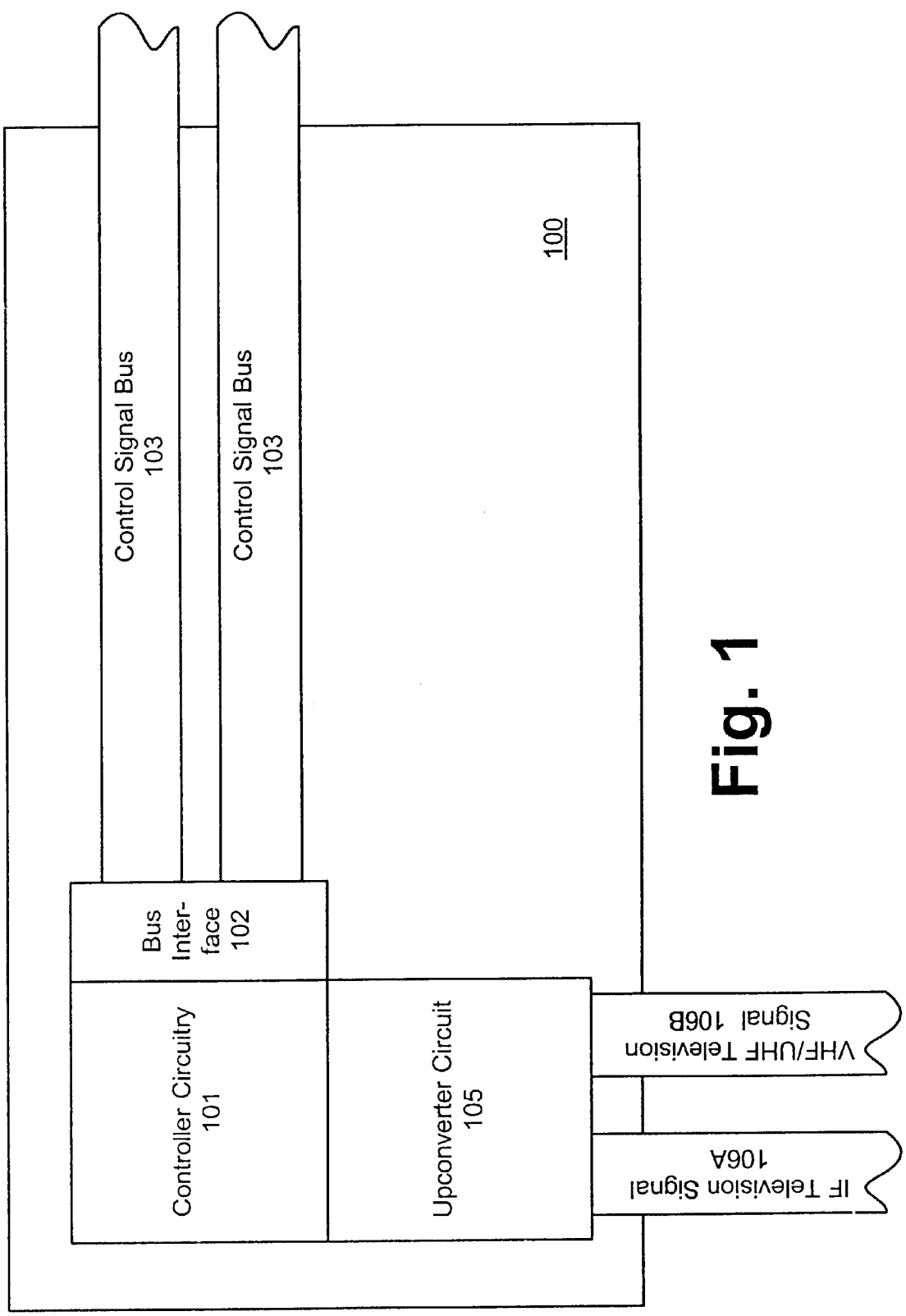
FIG. 1 is an illustration of a newly released television signal upconverter produced by the inventor's employer, General Instrument Corporation.

In December, 1998, the inventor's employer, General Instruments, released an upconverter which is illustrated in FIG. 1. The upconverter (100) of the present invention is used by a distributor of television signals such as a network broadcaster, a cable television company or a community television antenna operator (CATV).

Television signals, consisting of video and audio components, are generated at an intermediate frequency (IF). Prior to being broadcast, either over-the-air or over a cable network, the television signal must be converted to a higher frequency in one of two frequency bands, the very high frequency band (VHF) or the ultra-high frequency band (UHF). This conversion from IF to a higher VHF or UHF frequency can be performed by the upconverter (100) shown in FIG. 1.

With reference to FIG. 1, the IF television signal is provided over a co-axial signal cable (106A) to the upconverter circuitry (105). The upconverter circuitry (105) performs the conversion of the television signal from IF to VHF or UHF and outputs the converted signal over a second co-axial cable (106B).

In television broadcasting, an upconverter or an upconverter circuit (105) is provided for each channel being broadcast. To coordinate the broadcast of all the channels offered, a control signal bus (103) is provided between all the upconverters being used.

Each upconverter circuit (105) is controlled by a controller circuit (101). The bus (103) is connected to the controller circuitry (101) through a bus interface (102). The bus interface (102) provide the controller circuitry (101) with a control signal from the bus (103) so as to coordinate control of the upconverter circuit (105) with all other upconverters in use. Historically, the bus interface (102) and its connection to the controller circuitry (101) has been a point at which stray electrical current is generated or emitted.

Figure 2:
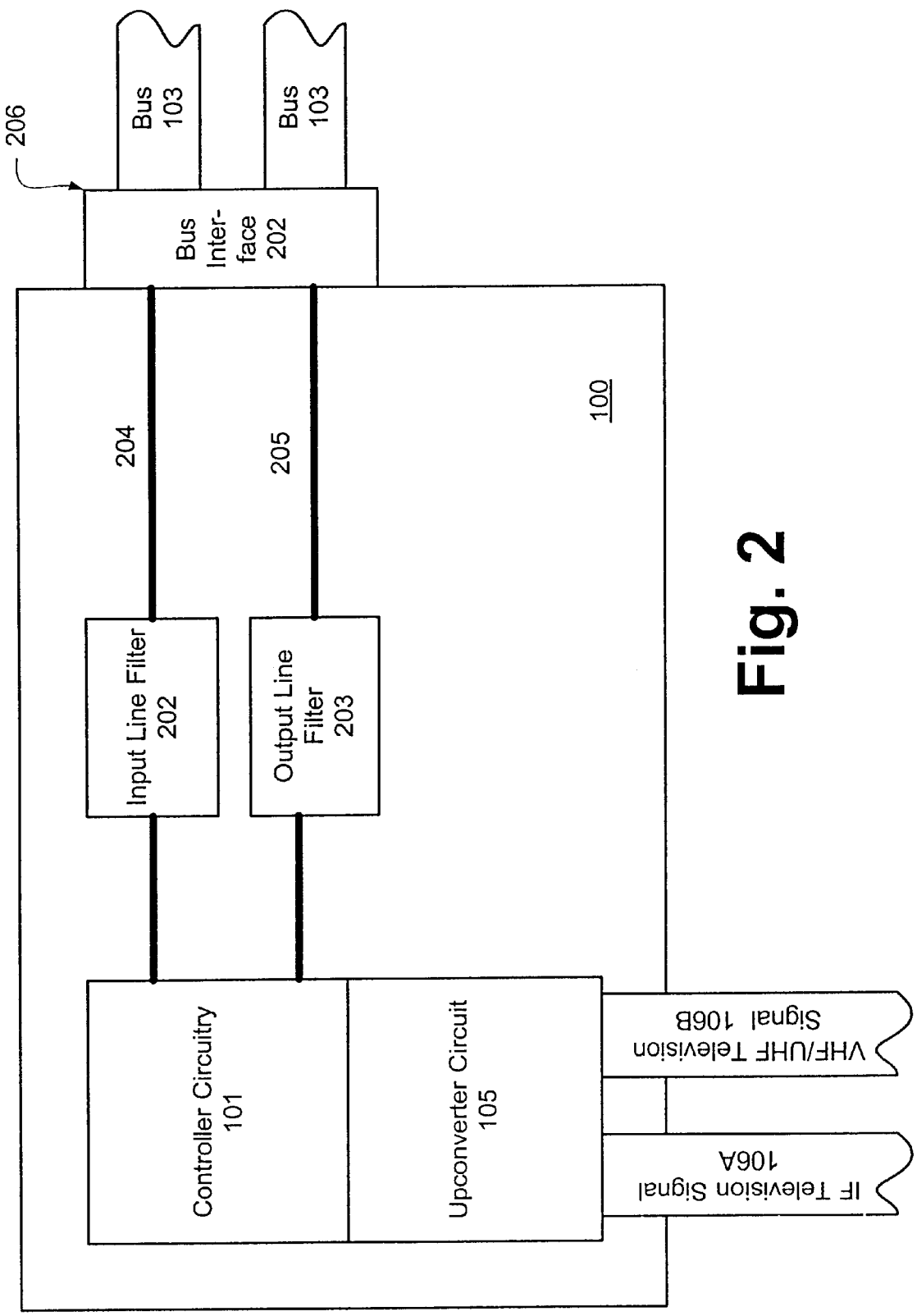
FIG. 2 is an illustration of a modified upconverter implementing the principles of the present invention.
Figure 3:
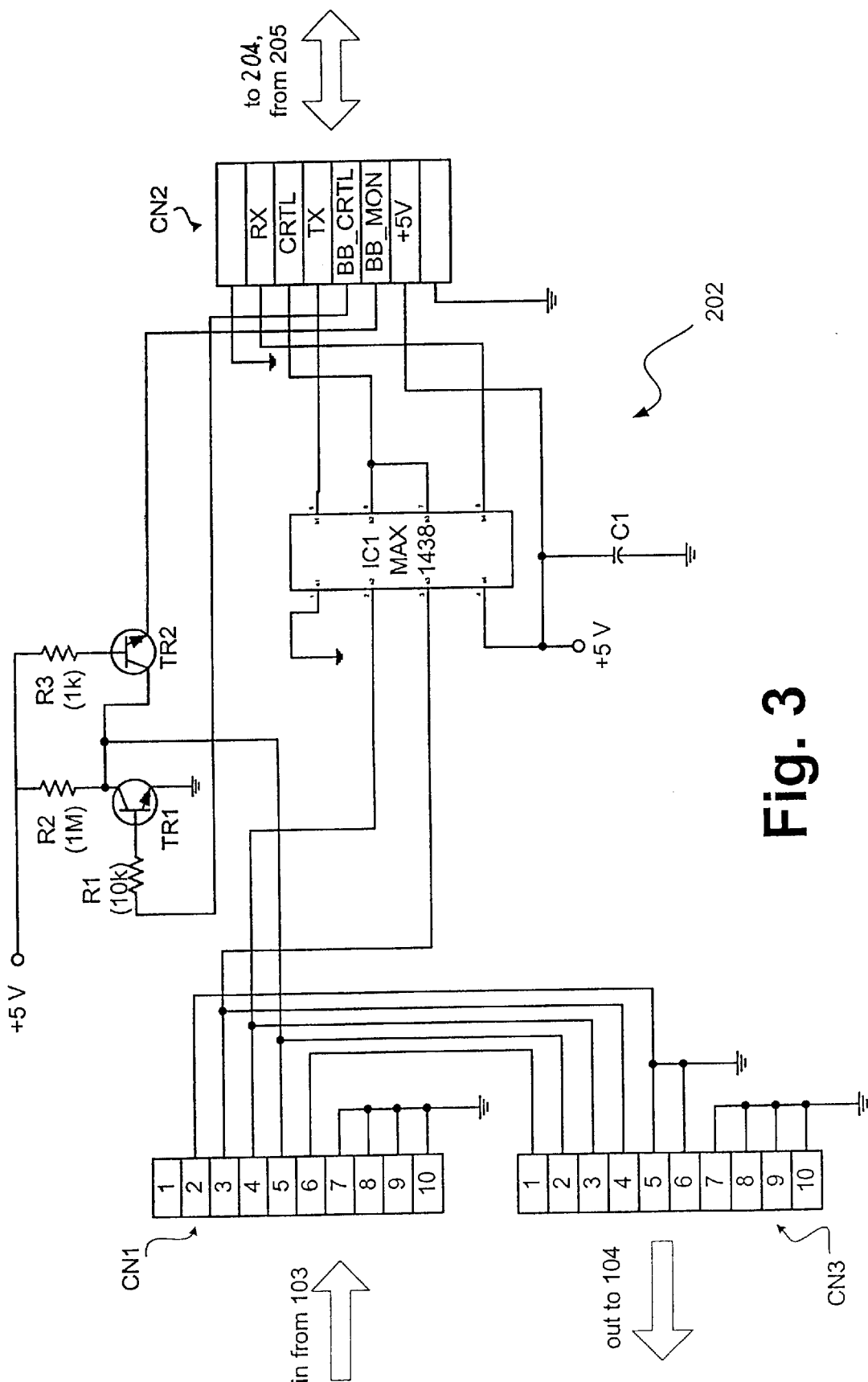
FIG. 3 is an illustration of a bus interface according to the present invention.

Consequently, a device and method for improving the upconverter of FIG. 1 and suppressing unwanted electromagnetic emissions is illustrated in FIG. 2. In the upconverter illustrated in FIG. 2, an improved bus interface (202) is provided. The details of the improved bus interface are illustrated in FIG. 3 and will be discussed in detail below.

As shown in FIG. 2, the improved bus interface (202) is separated from the control circuitry (101). Preferably, the bus interface (202) is mounted to an exterior surface of the housing of the upconverter (100). Additionally, the bus interface (202) may be provided in a shielded housing (206) which is more heavily shielded than the housing of the upconverter (100) so as to prevent unwanted current or other electromagnetic emissions from the interface (202).

An input line (204) is then provided internal to the upconverter (100) between the input bus (103) at the bus interface (202) and the controller circuitry (101). Likewise an output line (205) is provided internal to the upconverter (100) between the controller circuitry (101) and the output bus (103) at the bus interface (202).

With the provision of the input and output lines (204 and 205), a filtering element (202 and 203) can also be added to each line. These filters remove unwanted electromagnetic signals from the input and output lines (204 and 205) thereby suppressing unwanted electromagnetic emissions. The filtering elements (202 and 203) may be, for example, RC filters.

The upconverter of FIG. 2 produces, as a whole, less stray electrical current and other unwanted electromagnetic emissions than prior art devices. In particular, the upconverter of FIG. 2 more readily complies with CENELEC and other applicable emissions standards than prior art devices.

Turning now to FIG. 3, an embodiment of the bus interface (202) according to the principles of the present invention will be described. As shown in FIG. 3, the bus interface 202 includes three connectors. Connector (CN1) is a ten pin connector for receiving input from the input signal bus (103). Connector (CN3) is also a ten pin connector for outputting the upconverted signal to the output signal bus (104). Connector (CN2) is an eight pin connector for connecting the interface (202) with the internal input line (204) and output line (205).

Pins 7 to 10 of both bus connectors (CN1 and CN3) are grounded in the embodiment shown in FIG. 3. Pins 2 to 6 of the input connector (CN1) are connected to pins 5, 4, 3, 2 and 1 of the output connector (CN3), respectively. Pins 5 and 6 of the output connector (104) are also connected to ground.

An eight-pin integrated circuit (IC1) which is, for example, a MAX 1438 chip, is also provided. Using the standard numbering, the first pin of IC1 is grounded. The second pin is connected to pin 4 of the input connector (CN1). The third pin is connected to pin 3 of the input connector (CN1). The fourth pin is connected to a voltage source, e.g. +5 volts. The fifth pin is connected to pin 4 (TX) of the internal connector (CN2). The sixth pin is connected to pin 3 (CRTL) of the internal connector (CN2). The seventh pin is also connected to pin 3 (CRTL) of the internal connector (CN2). And, the eighth pin is connected to pin 2 (RX) of the internal connector (CN2).

Pins 1 and 8 (top and bottom, respectively, in FIG. 3) of the internal connector (CN2) are grounded. Pin 7 of the connector (CN2) is connected to the voltage source (+5V) in common with the fourth pin of the circuit (IC1). Both pin 7 of the internal connector (CN2) and the fourth pin of the circuit (IC1) are also connected through a capacitor (C1) to ground. The capacitor (C1) is, for example, 0.01 $\mu$F.

Two transistors (TR1 and TR2) are also provided as a means of communicating the status of the bus to other upconverters. The base of transistor (TR2) is connected though a resistor (R3) to a voltage source, e.g., +5 volts. The resistor (R3) is, for example, a 1 kΩ resistor. The emitter of the transistor (TR2) is connected to pin 6 (BB_MON) of the internal connector (CN2). The collector of the transistor (TR2) is connected to the collector of the transistor (TR1) and, through a resistor (R2), to the same voltage source (+5 V) to which the base of the transistor (TR2) is connected. The resistor (R2) is, for example, a 1 MΩ resistor.

The emitter of the transistor (TR1) is grounded. The base of the transistor (TR1) is connected through a resistor (R1) to pin 5 (BB_CRTL) of the internal connector (CN2). The resistor (R1) is, for example, a 10 kΩ resistor.

The configuration for an upconverter shown in FIG. 2, with or without the improved bus interface shown in FIG. 3, provides an upconverter which suppress unwanted electromagnetic emissions so as to more easily comply with applicable standards and regulations. The upconverter of the present invention can be safely used in close proximity with other electronic equipment at the headend of a television signal broadcasting facility without undue interference.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. An electronic device with suppressed electromagnetic emissions, the device comprising:
    a device circuit disposed within said device;
    a device circuit housing;
    a bus interface connected to input and output busses for providing a signal to and from said device, wherein said bus interface is disposed on an exterior surface of said device circuit housing and spaced apart from said device circuit to suppress electromagnetic emissions caused by IF, UHF, or VHF signals; and
    input and output lines connected between said bus interface and said device circuit.

2. The device of claim 1, wherein each of said input and output lines further comprise a filtering device for suppressing electromagnetic emissions.

3. The device of claim 1, wherein said bus interface is disposed in an interface housing disposed on said exterior surface of said device housing, wherein said interface housing is more heavily shielded against electromagnetic emissions than said device housing.

4. The device of claim 1, wherein each of said input and output lines further comprise a filtering device for suppressing electromagnetic emissions.

5. The device of claim 1, wherein said device circuit is an upconverter for converting an IF television signal to a VHF or UHF television signal.

6. The device of claim 1, wherein said bus interface comprises:
    an input connector connected to said input bus;
    an output connector connected to said output bus; and
    an internal connector connected to said input and output lines;
    wherein said input and output connectors are both multi-pin connectors in which five pins of said input connector are connected, respectively, five pins of said output connector.

7. The device of claim 6, wherein two pairs of mutually connected pins of said input and output connectors are connected through a circuit to said internal connector.

8. The device of claim 6, wherein a pair of mutually connected pins of said input and output connectors is connected through a circuit comprising two transistors to said internal connector.

9. The device of claim 8, wherein said circuit comprising two transistors comprises:
    a first transistor having a grounded emitter, a collector connected to a voltage source and a base connected to said internal connector; and
    a second transistor having an emitter connected to said internal connector, a collector connected to said collector of said first transistor and a base connected to said voltage source;
    wherein mutually connected collectors of said first and second transistors are also connected to a pin of said input connector.

10. A method of suppressing electromagnetic emissions in an electronic device comprising a device circuit, the method comprising:
    spacing a bus interface connected to input and output busses apart from said device circuit by a distance sufficient to suppress said emissions of electromagnetic radiation caused by IF, UHF, or VHF signals as a result of interaction of said device circuit and said interface;
    mounting said bus interface on an exterior surface of a housing for said device circuit; and
    connecting input and output lines between said bus interface and said device circuitry.

11. The method of claim 10, further comprising filtering unwanted electromagnetic signals from each of said input and output lines to further suppress electromagnetic emissions.

12. The method of claim 10, further comprising mounting said bus interface in an interface housing disposed on said exterior surface of said device housing, wherein said interface housing is more heavily shielded against electromagnetic emissions than said device housing.

13. The method of claim 10, further comprising filtering unwanted electromagnetic signals from each of said input and output lines to further suppress electromagnetic emissions.

14. The method of claim 10, further comprising upconverting an IF television signal to a VHF or UHF television signal with said device circuit, said IF television signal being provided over said input bus and said input line through said bus interface and said VHF or UHF television signal being provided over said output line to said output bus through said bus interface.

15. An electronic device with suppressed emissions of electromagnetic radiation, the device comprising:
    processing means disposed within said device for signal processing;
    a bus interface means disposed on an exterior surface of a device housing which houses said processing means for connecting to input and output busses and for providing data to and from said processing means, wherein said bus interface means is spaced apart from said processing means to suppress emissions of electromagnetic radiation cased by IF, UHF, or VHF signals; and input and output lines connected between said bus interface means and said processing means.

16. The device of claim 15, wherein each of said input and output lines further comprise a filtering means for suppressing electromagnetic emissions.

17. The device of claim 15, wherein said bus interface means are disposed in an interface housing means disposed on said exterior surface of said device housing, wherein said interface housing means are more heavily shielded against electromagnetic emissions than said device housing.

18. The device of claim 15, wherein each of said input and output lines further comprise a filtering means for suppressing electromagnetic emissions.

* * * * *